United States Patent [19]
Ghoshal

[11] Patent Number: 5,966,941
[45] Date of Patent: Oct. 19, 1999

[54] THERMOELECTRIC COOLING WITH DYNAMIC SWITCHING TO ISOLATE HEAT TRANSPORT MECHANISMS

[75] Inventor: Uttam Shyamalindu Ghoshal, Austin, Tex.

[73] Assignee: International Business Machines Corporation, Armonk, N.Y.

[21] Appl. No.: 08/988,621

[22] Filed: Dec. 10, 1997

[51] Int. Cl.[6] ............................................. F25B 21/02
[52] U.S. Cl. .................................. 62/3.7; 62/3.6; 165/277
[58] Field of Search ........................... 62/3.2, 3.3, 3.7, 62/188; 165/277

[56] References Cited

U.S. PATENT DOCUMENTS

| | | | |
|---|---|---|---|
| 4,304,294 | 12/1981 | Reisman et al. | 165/277 |
| 5,130,276 | 7/1992 | Adams et al. | |
| 5,279,128 | 1/1994 | Tomatsu et al. | |
| 5,720,171 | 2/1998 | Osterhoff et al. | 62/3.2 |

FOREIGN PATENT DOCUMENTS

| | | |
|---|---|---|
| 0667498 | 8/1995 | European Pat. Off. . |
| 94/28364 | 12/1994 | WIPO . |

OTHER PUBLICATIONS

"Heat Pump Devices", 5–39966, Feb. 19, 1993, Japan Application (Translation).
"Heat Pump Devices", 5–172424, Jul. 9, 1993, Japan Application (Translation).

*Primary Examiner*—William Doerrler
*Assistant Examiner*—Melvin Jones
*Attorney, Agent, or Firm*—Casimer K. Salys

[57] ABSTRACT

Apparatus and method for sub-ambient cooling using thermoelectric element dynamics in conjunction with pulsed electrical power and selectively enabled thermal coupling to the cold sink. In one form, Peltier devices are dynamically enabled using pulses of electrical power while the thermal path between the cold side of the Peltier device and the cold sink is selectively switched in relative synchronism between conductive states responsive to the dynamics of the Peltier device temperatures. Switched coupling of the thermal connection between the cold sink and the Peltier device materially improves efficiency by decoupling Joule heating and conductive heat transfer losses otherwise conveyed from the Peltier device. Preferable implementations utilizes MEMS to accomplish the selective thermal switching, whereby sub-ambient cooling capacity is increased by parallel operation of multiple Peltier devices and MEMS switches.

92 Claims, 7 Drawing Sheets

{ NO COMPRESSOR
NO EVAP. COILS
NO COND. COILS
NO CFC

THERMOELECTRIC COOLING WITH DYNAMIC SWITCHING TO ISOLATE HEAT TRANSPORT MECHANISMS

CROSS-REFERENCE TO RELATED APPLICATIONS

The present application is related to co-pending and presently allowed U.S. patent application Ser. No. 08/988,429 filed Dec. 10, 1997, and assigned to the assignee of the present application.

FIELD OF THE INVENTION

The present invention generally relates to cooling systems. More particularly, the invention is directed to systems attaining high relative efficiency thermoelectric cooling through the application of selectively switched electrical power and selectively switched thermal coupling concepts and configurations.

BACKGROUND OF THE INVENTION

Sub-ambient cooling is conventionally accomplished through gas/liquid vapor compression based refrigeration cycles using Freon type refrigerants to implement the heat transfers. Such refrigeration systems are used extensively for cooling human residences, foods, and vehicles. Sub-ambient cooling is also often used with major electronic systems such as mainframe computers. Though vapor compression cooling can be very efficient, it does require significant moving hardware, including at a minimum, a compressor, a condenser, an evaporator, and related coolant transfer plumbing. As a result of the complexity and associated high cost, vapor compression cooling has not found material acceptance in small cooling applications, for example personal computers.

The fact that CMOS logic can operate materially faster as the temperature decreases has been well known for at least ten years. For example, if CMOS logic devices are operated at −50° C., the performance is improved by 50 percent over room ambient temperature operation. Liquid nitrogen operating temperatures, in the range of −196° C., have shown 200 percent performance improvements. Similar benefits have shown to accrue for integrated circuit wiring, where metal wiring resistances decrease by a factor of 2 for integrated circuits operated at −50° C. in comparison to room ambient operation. This improvement rivals the recent technological breakthrough of using copper wiring in integrated circuits to reduce interconnect resistance and thereby effectively increase the operating frequencies attainable. Thus, sub-ambient operation of integrated circuit logic devices, such as field effect transistors, as well as the interconnect wiring can materially improve the integrated circuit performance, leaving the question of how to accomplish such cooling in the confines of an ever decreasing size and materially shrinking cost environment.

Thermoelectric cooling is one alternative that has found some usage given the compact size of the prevalently used Peltier devices. Peltier device thermoelectric cooling is also very reliable in that the cooling is totally solid state. The key negative aspect of thermoelectric cooling is the inefficiency, wherein a Peltier device cooling system efficiency is commonly only in the range of 20 percent for a relatively nominal temperature drop between the cold sink and the ambient. For example to cool at the rate of one watt at a sub-ambient temperature of 0° C. the Peltier cooling system must be powered with 5 watts. As the amount of heat to be transferred increases, the total power to be dissipated into the ambient mandates large convection devices and high output power supply circuits. Therefore, Peltier device thermoelectric cooling has not been considered a broadly applicable technology for improving integrated circuit performance.

To understand how the present invention improves thermoelectric cooling efficiency it is necessary to understand why Peltier device thermoelectric cooling is inefficient. A Peltier device is fabricated from semiconductor material such as bismuth telluride or lead telluride. Though new materials are now being evaluated in various universities, they have yet to reach fruition. The commonly used Peltier materials exhibit very high electrical conductivity and relatively low thermal conductivity, in contrast to normal metals which have both high electrical and thermal conductivity. In operation the Peltier devices transport electrons from a cold sink, at temperature $T_{cold}$, to a hot sink, at temperature $T_{hot}$, in response to an electric field formed across the Peltier device. However, there are other mechanisms affecting Peltier device efficiency, which mechanisms degrade the net transport of the heat energy from the cold sink to the hot sink.

FIG. 1 schematically depicts a conventional Peltier type thermoelectric element (TE) 1 with DC power supply 2 created the electric field across TE 1 while at a load current 3. The desired heat transfer is from cold sink 4, at temperature $T_{cold}$, to hot sink 6, at temperature $T_{hot}$. As indicated in the equation of FIG. 1, the net heat energy transported is composed of three elements, the first representing the Peltier effect (thermoelectric) contribution, the second defining negative Joule heating effects, and the third defining negative conductivity effects. The thermoelectric component is composed of the Seebeck coefficient, the temperature of operation ($T_{cold}$) and the current being applied. The Joule heating component reflects that roughly half the Joule heating goes to the cold sink and remainder to the hot sink. Lastly, the negative component attributable to thermal conduction represents the heat flow through the Peltier device, as defined by the thermal conductivity of the Peltier device, from the hot sink to the cold sink. See equation (1).

$$q = \alpha T_{cold} I - \tfrac{1}{2} I^2 R - K\Delta T \tag{1}$$

Since the thermoelectric component of the heat transport increases in direct proportion to the current, while the Joule heating increases in proportion to the square of the current, and the thermal conduction is in direct proportion to the hot sink to cold sink temperature difference, the equation clearly reflects how quickly the Peltier device becomes inefficient.

Equation (2) defines a coefficient of performance for the Peltier device. The coefficient is the ratio of the net heat energy transported at low temperature to the power consumed in the Peltier device. For a typical bismuth telluride material Peltier device, the coefficient of performance is less than 0.3.

$$\eta = \frac{\alpha T_{cold} I - \dfrac{1}{2} I^2 R - K\Delta T}{I^2 R + \alpha I \Delta T} \tag{2}$$

Note that the numerator of equation (2) represents the net cooling capability of the Peltier device. The denominator of equation (2) represents the total energy provided by external power source 2. The individual elements of the numerator were described earlier. The first term in the denominator is the total Joule heating, while the second term is the heat energy transport work done by the Peltier device in moving energy from the $T_{cold}$ sink to the $T_{hot}$ sink. Based upon this relationship, the maximum coefficient of performance possible in the configuration of FIG. 1 is given by equation (3).

$$\eta_{max} = \left(\frac{T_{cold}}{\Delta T}\right)\left(\frac{\gamma - \frac{T_{hot}}{T_{cold}}}{\gamma + 1}\right) \quad (3)$$

The parameter γ can be expressed in terms of the Seebeck coefficient α, electrical conductivity σ and thermal conductivity λ as set forth in equation (4).

$$\gamma = \sqrt{1 + \frac{\gamma^2}{RK}\left(\frac{T_{hot} + T_{cold}}{2}\right)} = \sqrt{1 + \frac{\alpha^2 \sigma}{\lambda}\overline{T}}$$
$$= \sqrt{1 + Z\overline{T}} \quad (4)$$

Note that the first factor in equation (3) is the Carnot efficiency, which is the maximum efficiency possible for any heat pump operating between two temperature sinks $T_{cold}$ and $T_{hot}$. The second factor represents the non-ideal thermoelectric cooling, which can also be characterized by a figure of merit $Z\overline{T}$. Note that $\pi_{max} \rightarrow (T_{cold}/\Delta T)$ as $\gamma \rightarrow \infty$.

To date it has been very difficult to develop a thermoelectric material which yields high values of $Z\overline{T}$. The prevalent materials for thermoelectric coolers have been bismuth telluride ($Bi_2Te_3$) and lead tellurium (PbTe). These materials have $Z\overline{T}$ values of approximately 0.3 at room temperature. Recent work at universities has shown that $Z\overline{T}$ values approaching 1 may be possible in lead tellurium quantum wells and multilattices. However, even with these materials, the thermoelectric cooling is not competitive with mechanical vapor compression cooling systems.

Another constraint of Peltier device cooling is the limited temperature excursion below ambient attainable. That limitation arises from the fact that temperature span is constrained by efficiency, a parameter which degrades quickly as the temperature differential increases. The maximum temperature differential possible $T_{max}$ is given by equation (5).

$$\Delta T_{max} = \frac{1}{2}Z T^2_{cold} \quad (5)$$

For bismuth telluride having a $Z\overline{T}$ of approximately 0.3, $T_{max}$ is 45° K at 300° K.

Thus, there are a number of very fundamental constraints on efficiency and differential temperature that limit the use of conventional thermoelectric elements for sub-ambient cooling applications.

SUMMARY OF THE INVENTION

The present invention overcomes the fundamental constraints of conventional thermoelectric element cooling through the application of dynamic modulation to electrical power and thermally conductive paths connecting the thermoelectric element to the power supply and cold sink, respectively.

In one form, the invention relates to a thermoelectric cooling apparatus, comprising a first thermal sink of a first nominal temperature, a second thermal sink of a second nominal temperature, the second temperature being relatively greater than the first temperature, a thermoelectric element continuously coupled to the second thermal sink, means for selectively switching a thermal coupling of the thermoelectric element to the first thermal sink, and means for selectively switching an electrical voltage across the thermoelectric element.

In another form, the invention relates to a thermoelectric cooling apparatus, comprising a first thermal sink of a first nominal temperature, a second thermal sink of a second nominal temperature, the second temperature being relatively greater than the first temperature, a third thermal sink of the second nominal temperature, the third thermal sink being electrically separate from the second thermal sink, a first thermoelectric element thermally coupled to the second thermal sink, a second thermoelectric element thermally coupled to the third thermal sink, means for selectively switching a thermal coupling of the first and second thermoelectric elements to the first thermal sink, and means for selectively switching an electrical voltage across the first and second thermoelectric elements.

In a still further form, the invention relates to a method of operating a thermoelectric cooling apparatus having a first thermal sink operable at a first nominal temperature, a second thermal sink operable at a second nominal temperature relatively greater than the first nominal temperature, and a thermoelectric element coupled to the second thermal sink, comprising the steps of transmitting thermal energy from the thermoelectric element to the second thermal sink through a continuous coupling, selectively switching transmission of thermal energy between the thermoelectric element and the first thermal sink, and selectively enabling an electric voltage across the thermoelectric element.

In a still further form, the invention relates to a method of operating a thermoelectric cooling apparatus having a first thermal sink operable at a first nominal temperature, a second thermal sink operable at a second nominal temperature relatively greater than the first nominal temperature, a third thermal sink operable at the second nominal temperature and in electrical separation from the second thermal sink, a first thermoelectric element thermally coupled to the second thermal sink, a second thermoelectric element thermally coupled to the third thermal sink, comprising the steps of transmitting thermal energy from the first thermoelectric element to the second thermal sink through a continuous coupling, transmitting thermal energy from the second thermoelectric element to the third thermal sink through a continuous coupling, selectively switching transmission of thermal energy between the first and second thermoelectric elements and the first thermal sink, and selectively enabling an electric voltage across the first and second thermoelectric elements.

In a particularized form of the invention, complementing impurity type thermoelectric elements are connected in electrical series and powered by pulses of switched voltage. The thermoelectric elements are thermally coupled to individual electrically isolated hot sinks at one side, and are thermally coupled from a common connection of their respective cold sides to a thermal switch which selectively establishes a thermal path to the cold sink. Selective but synchronized operation of the electrical switch and the thermal switch provides thermal energy transport, from the cold sink, through the thermal switch, and through the pair of thermoelectric elements to respective hot sinks, at an efficiency exceeding the static mode operation of such thermoelectric elements. The use of transient principles allows the relative isolation of the thermoelectric heat transport mechanism from the thermal conduction and Joule heating mechanisms. The efficient of performance is expected to approach Carnot efficiency.

These and other features of the invention will be more clearly understood and appreciated upon considering the detailed embodiments described hereinafter.

DESCRIPTION OF THE PREFERRED EMBODIMENT

Figure 1:
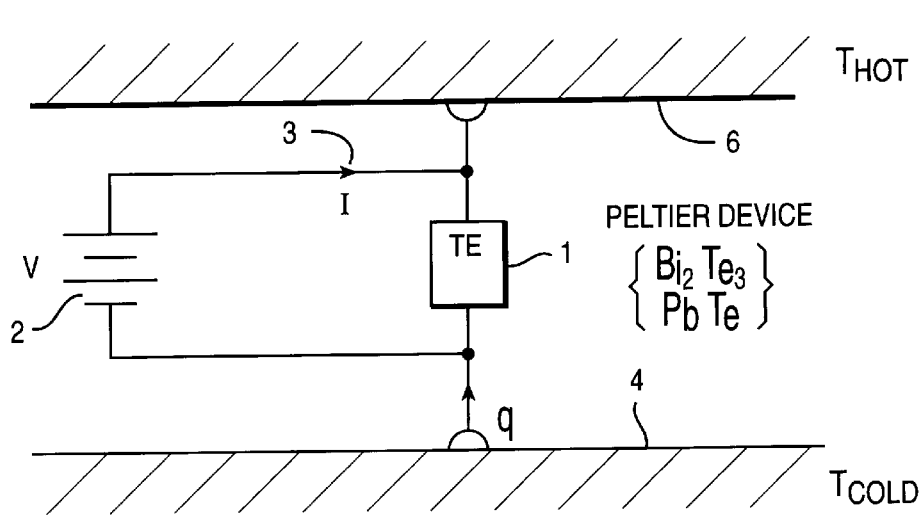
FIG. 1 schematically depicts a conventional statically operable Peltier device cooling system.

The conceptual groundwork for the present invention involves a separate of the dependency between thermal conductivity and electrical conductivity, a dependency which has heretofore limited the temperature differential and efficiency of conventional thermoelectric element heat transfers. Mathematically, the objective is to effectively isolate the elements contributing to net heat transfer relationship specified in FIG. 1 through the use of thermoelectrical switches to dynamically maximize thermoelectric heat transfer while minimizing Joule heating and conduction heat transfer. Thermoelectric element transient effects are used to increase efficiency by synchronizing the pulsed voltage applied across the thermoelectric element and the switched thermal conductivity coupling between the cold side of the thermal electric element and the cold sink. In a preferred implementation, the switching of thermal conductivity is accomplished using microelectromechanical systems (MEMS) thermal switches, wherein arrays of multiple miniature thermoelectric elements and related MEMS thermal conductivity switches are used to increase heat transfer capacity.

Figure 2:
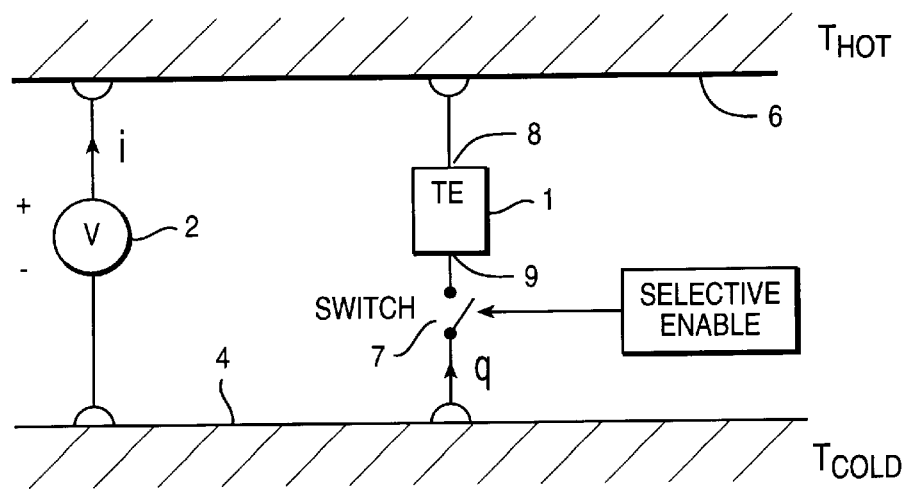
FIG. 2 schematically depicts a single switch, single thermoelectric element, embodiment of the invention.

FIG. 2 schematically depicts a minimum element configuration of the invention. Thermoelectric element 1 is continuously coupled to hot sink 6 through a thermal path having a heat transfer q. The opposite end of thermoelectric element 1, from the perspective of voltage application and responsive heat transfers, is thermally coupled through thermal switch 7 to cold sink 4. As embodied in FIG. 2, switch 7 also conducts electrical current, allowing the application of voltage 2 across thermoelectric element 1 when switch 7 is closed. At the start of a cycle thermoelectric element 1 is at $T_{hot}$ by virtue of the thermal coupling to hot sink 6. Upon pulsed closure of switch 7, thermoelectric element 1 quickly establishes a relative temperature differential between hot end 8 and cold end 9, the temperature differential allowing heat transfer from cold sink 4 through thermal switch 7. With time, however, Joule heating effects within thermoelectric element 1 elevate the average temperature of thermoelectric element 1 so that the net heat transfer through thermoelectric element 1 begins to decrease. At this point, switch 7 is opened, disconnecting both the electrical power and the thermal coupling. The residual thermal energy in thermoelectric element 1 at the time of switch disablement elevates the temperature sufficiently to provide an exponentially decaying heat transfer between thermoelectric element 1 and hot sink 6. When the temperature of thermoelectric element 1 has decayed to that approaching hot sink 6, the cycle is repeated. The transient character of the operation is tied to the fact that thermoelectric heat transfer occurs immediately upon the receipt of a relative voltage whereas Joule heating and subsequent thermoelectric element conduction loss are delayed effects. Thus the invention relies on the different time scales and time constants of electrical and thermal conduction.

The basis concept for improving efficiency, as described with reference to FIG. 2, exhibits some less pronounced but still significant inefficiency contributors. The most pronounced ones are the Joule heating in switch 7 when the switch is closed, the thermal conductance losses through switch 7 when the switch is in an open state, and the heat loss due to heat capacity of thermoelectric element 1.

A detailed analysis of the transients provides that the heat loss due to the heat capacity of the thermoelectric element is approximately equal to the Fourier conductance term. Hence the expression for the coefficient of performance earlier set forth as equation 2, is more fully described by equation (6).

$$\eta_1 \approx \frac{\alpha I T_{cold} - I^2 R_s - K_s \Delta T - K \Delta T}{\alpha I \Delta T + I^2 (R + R_s)} \tag{6}$$

In equation (6), the terms $R_s$ and $K_s$ are the ON electrical resistance and the OFF thermal conductance of the switch. The ON electrical resistance $R_s$ of the switch can commonly be made small at the expense of increasing the OFF thermal conductance $K_s$.

Figure 3:
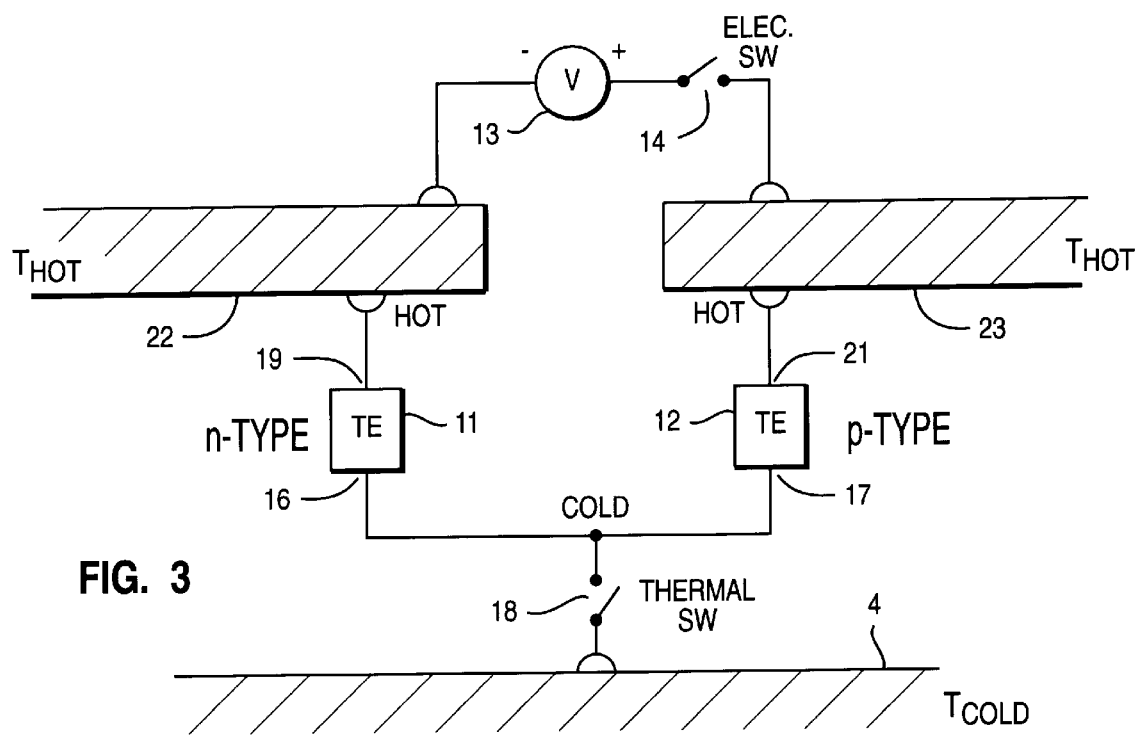
FIG. 3 schematically depicts a single thermal switch double thermoelectric element embodiment of the invention.

One approach to improving the coefficient of performance is shown by the embodiment in FIG. 3, where the electrical switch is placed at the hot sink through the judicious placement and connection of n-type and p-type thermoelectric elements. Thereby, the heating associated with the electrical switch is eliminated as a contributor to the coefficient of performance. Mathematically this allows the coefficient of performance to be rewritten as set forth in equation (7).

$$\eta_2 \approx \frac{\alpha I T_{cold} - K \Delta T}{I^2 R + \alpha I \Delta T} \tag{7}$$

The effect is that the maximum coefficient of performance is slightly higher, typically 20%, than that associated with the single switch implementation in FIG. 2, as mathematically described by equation (3). See equation (8).

$$\eta_{2max} = \left(\frac{T_{cold}}{\Delta T}\right)\left(\frac{\gamma - 1}{\gamma + 1}\right) \tag{8}$$

Although the enhancement in coefficient of performance is not dramatic, the difference is particularly significant for spot cooling applications. In this regard, note that the net cooling power of the thermoelectric cooler as represented by the numerator of equation (9) indicates that the maximum temperature is effectively unbounded.

$$\Delta T = \left(\frac{\alpha T_{cold}}{K}\right)I \quad (9)$$

Therefore, the maximum temperature differential can be increased significantly by increasing the current and in that context making thermoelectric cooling practical for small sensors and specialized circuits on silicon die. Such localized or spot cooling applications are particularly useful in voltage controlled oscillators, phase detectors, mixers, low noise amplifers, lasers, photodiodes, and various material type optoelectric circuits. In theory at least, spot cryogenic temperature cooling may be possible in limited applications. The use of multiple impurity type thermoelectric elements and a separate electrical switch provides significant potential as to efficiency and temperature range.

The embodiment in FIG. 3 introduces a number of inter-related refinements. First, multiple thermoelectric elements are used. Secondly, the timing of the electric power as applied to the thermoelectric elements is separated from the timing of the thermal switch coupling the cold end of the thermoelectric elements to the cold sink. Lastly, the switch connecting the cold end of the thermoelectric elements to the cold sink is solely a thermal switch, eliminating any electrical conduction requirements and the Joule losses associate with a current flow through the switch. The embodiment in FIG. 3 utilizes two thermoelectric elements, n impurity type thermoelectric element 11 and p impurity type thermoelectric element 12. This configuration allows the shared use of single voltage source 13, as enabled through electrical switch 14, while having cold ends 16 and 17 of respective thermoelectric elements 11 and 12 thermally coupled through thermal switch 18 to cold sink 4. Hot ends 19 and 21 of respective thermoelectric elements 11 and 12 are thermally and electrically connected to respective hot sinks 22 and 23, which hot sinks are electrically separate to effectuate the use of shared voltage source 13.

Though the operation of the two thermoelectric element embodiment in FIG. 3 is analogous to that of the single thermoelectric element embodiment in FIG. 2, the isolation of the thermal switch and the electrical switch provide greater flexibility in defining the respective duty cycles and switching synchronizations. Though electrical switch 14 and thermal switch 18 will both operate with very short duty cycles, and exhibit relatively synchronous operation one to another, the timing of the closure and opening cycles are likely to differ depending on the transient characteristics of the thermoelectric elements and conductive path couplings to the hot and cold sinks. For example, improved thermal coupling would suggest that electrical switch 14 close first, thermal switch 18 close momentarily thereafter, electrical switch 14 open somewhat later and thermal switch 18 open somewhat after the opening of electrical switch 14. The underlying objective of the switching operations being to maximize the efficiency of the heat transfer from cold sink 4 to hot sinks 23 and 24.

Figure 4:
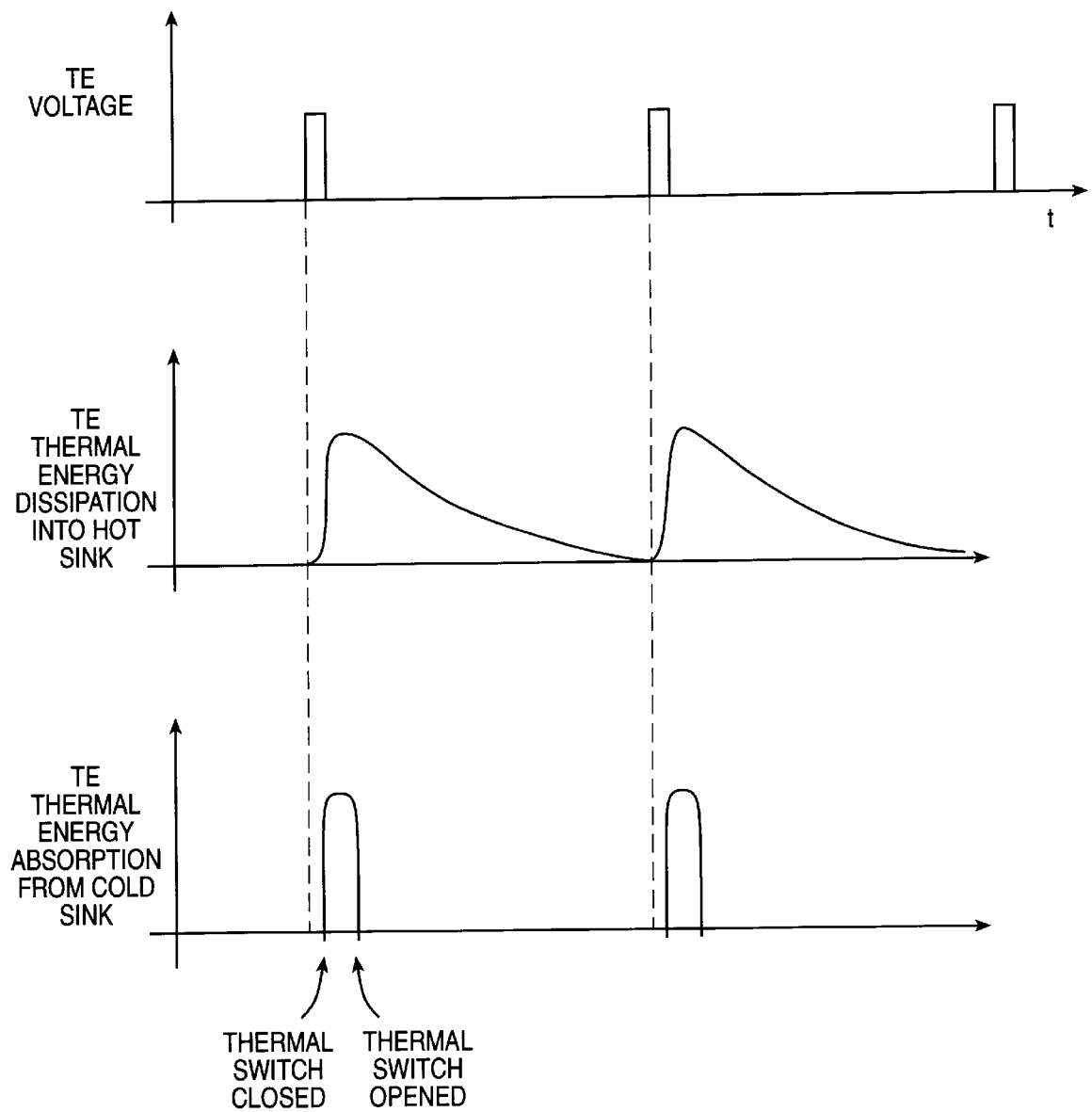
FIG. 4 schematically depicts relative time plots of the electrical power and the thermal energy transports per the embodiment in FIG. 3.

FIG. 4 schematically depicts by plots illustrative voltage and thermal energy transport waveforms associated with the operation of the embodiment in FIG. 3. The first plot shows the pulsed nature of the voltage applied across the thermoelectric elements. The second plot illustrates the thermal transient and associated decay of the thermal energy dissipated into the hot sink. The last plot illustrates the thermal energy absorption from the cold sink through the thermal switch. The plots in FIG. 4 are schematic in that they are intended to illustrate general concepts rather than to portray particularized time related magnitudes.

Figure 5:
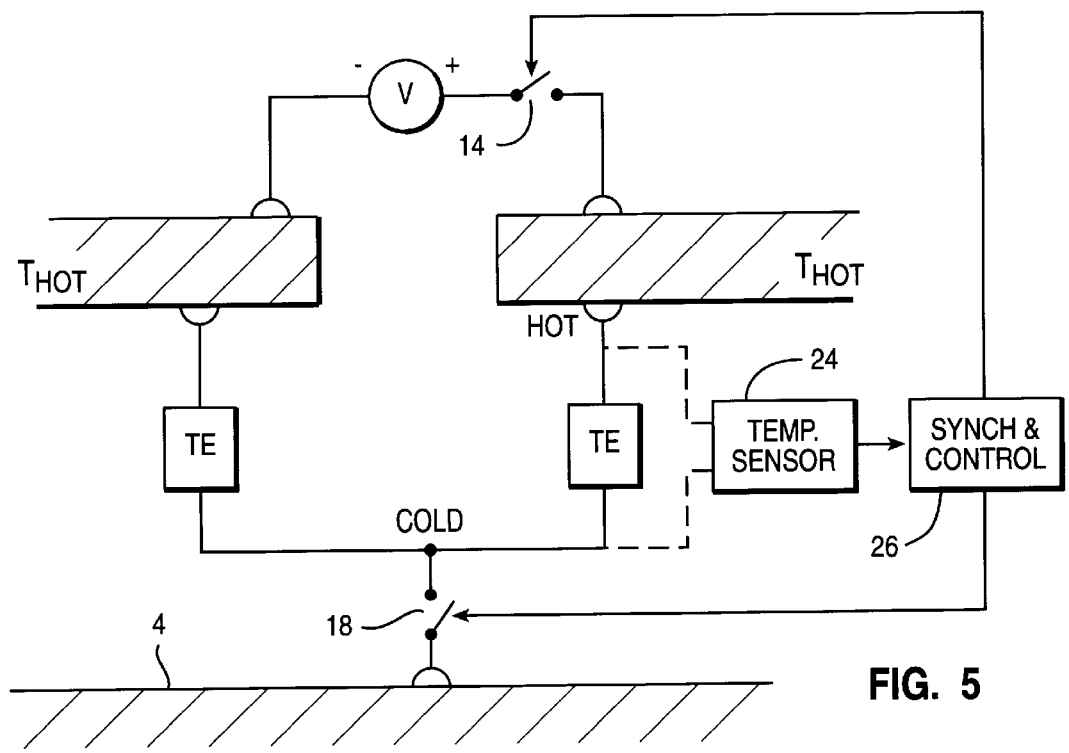
FIG. 5 schematically depicts a closed loop implementation of the single thermal switch configuration in FIG. 3.

FIG. 5 schematically illustrates an extension of the preferred embodiment in FIG. 3, wherein the enablements of electrical switch 14 and thermal switch 18 are performed in response to inputs from temperature sensor 24. Temperature sensor 24 provides an input to synchronizing control 26 to operate switches 14 and 18 in response to the actual temperatures at the hot, cold, or both ends of the thermoelectric elements. Though the synchronism and duty cycle characteristics of switches 14 and 18 remain relatively similar to those in for the embodiment in FIG. 3, the use of sensed temperature optimizes efficiency by using actual rather than estimated thermal characteristics to operate switches 14 and 18. The implementation in FIG. 5 allows adjustment in the switch timing to compensate for such effects as greater hot sink temperatures or lower cold sink temperatures within the context of the same cooling apparatus.

Figure 6:
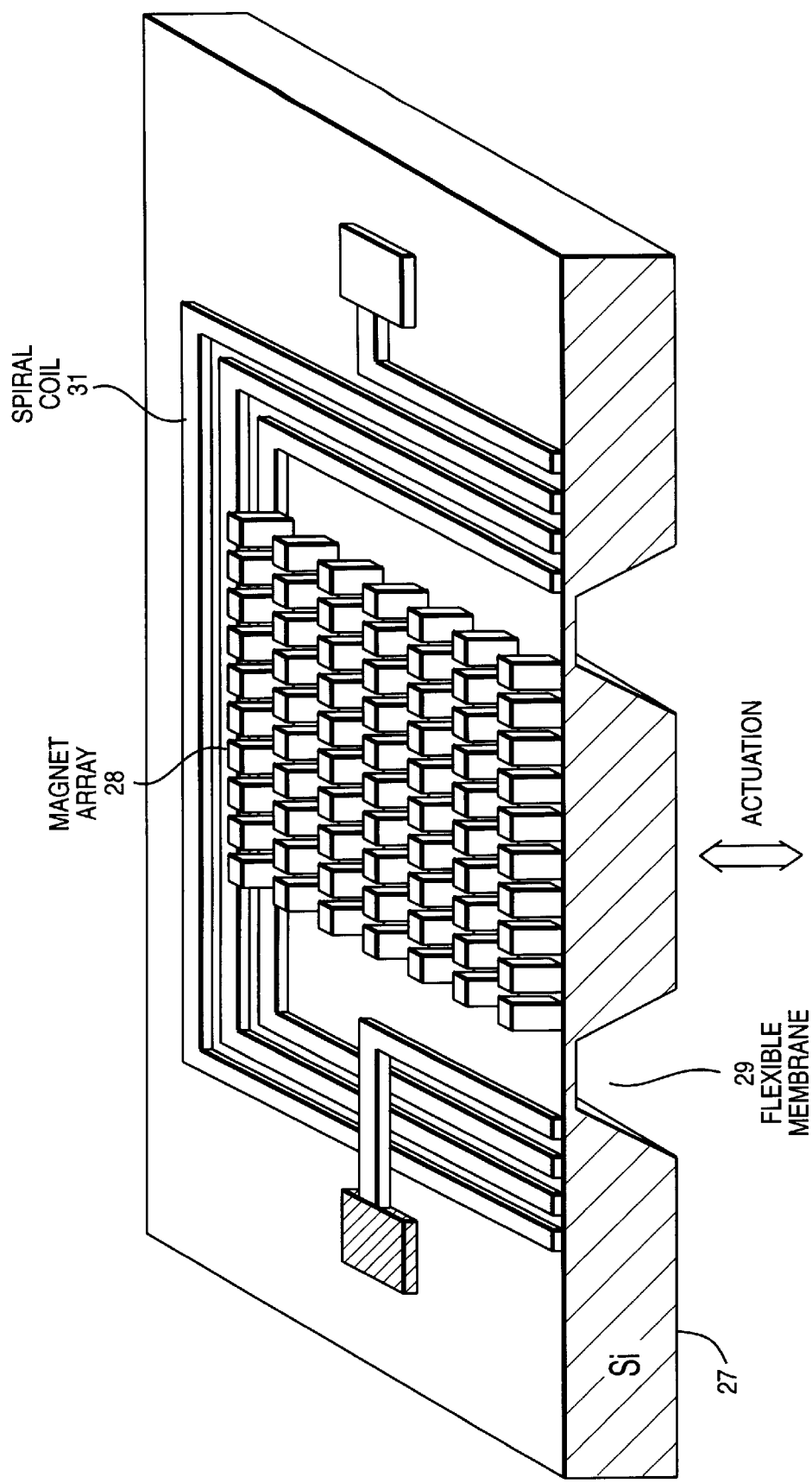
FIG. 6 schematically depicts a microelectromechanical systems (MEMS) device.

FIG. 6 schematically illustrates the structure of a representative microelectromechanical systems (MEMS) thermal switch of the type particularly suited to the present invention. Since MEMS technology is still in its infancy, the switch depicted in FIG. 6 merely illustrates one of many potential thermal switch configurations suitable to provide a selective thermal coupling between the thermoelectric element and the cold sink. The thermal switch shown in FIG. 6 is fabricated using conventional integrated circuit techniques so as to form on a surface of silicon chip 27 an array of nickel magnets 28 amenable to a slight displacement by movement at thin flexible membranes 29. Introduction of an electrical current into spiral coil 31 produces a force adequate to translate the magnetic array in a direction perpendicular to the plane of the silicon chip. The MEMS switch in FIG. 6 should have a relatively low thermal conductivity when opened yet a relatively high thermal conductivity when closed by actuation. If the MEMS device in FIG. 6 is to accomplish both electrical and thermal switching, refinements are likely to be necessary to lower the "on" resistance of the switch.

Figure 7:
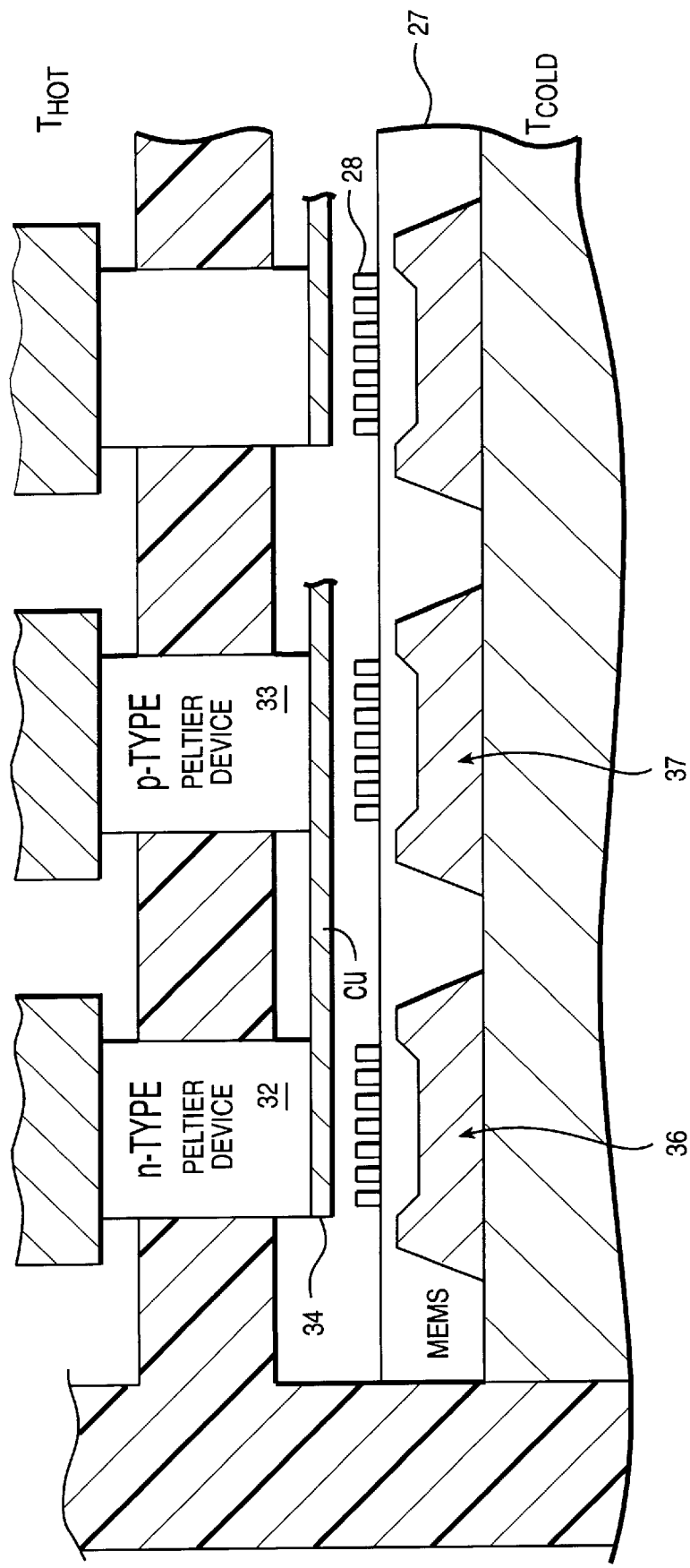
FIG. 7 depicts by schematic cross-section an array of MEMS devices and Peltier type thermoelectric elements.

FIG. 7 illustrates the use of an array of MEMS devices to selectively establish thermal connections between the Peltier type thermoelectric devices and a cold sink. Peltier devices 32 and 33 are electrically interconnected by copper conductor 34 to replicate the functions associated with the depiction in FIG. 3. The spacing between copper layer 34 and magnetic arrays 28 of MEMS switches 36 and 37 is expected to be in the nominal range of half a micron. This dimension is expected to allow a nominal size electrical coil 31 (FIG. 6) to initiate actuation of the switch structures. Since switch cycling is expected to occur in the order of seconds, the reliability associated with kilohertz frequency switching of MEMS devices should not be a problem.

The MEMS type thermal switch described with reference to the illustrations in FIGS. 6 and 7 is merely one of many potential thermal switch configurations. For example, it is fully contemplated that electrostatic forces generated in capacitive switch structures could be used to accomplish similar objectives. The underlying goal for all the switches is to maximize the thermal conductivity extremes for switch positions, such that when the switch is closed the thermal path between the thermoelectric element and the cold sink has a maximum thermal conductance while for the open switch the thermal conductance is the minimum attainable.

The depiction in FIG. 7 portrays that the thermoelectric cooling system of the present invention is preferably composed of plural thermoelectric elements and MEMS switches configured in arrays. The multiplicity of thermoelectric elements and switches ensures that the transient characteristics which underlie the present invention can be achieved within the dimensions of the thermoelectric element and switch materials. Stated otherwise, it is expected that the isolation of the thermoelectric heat transfer from the Joule heating and conduction components is most effectively accomplished with relatively small thermal capacity thermoelectric elements, commonly Peltier devices, and correspondingly small MEMS type thermal switches.

Figure 8:
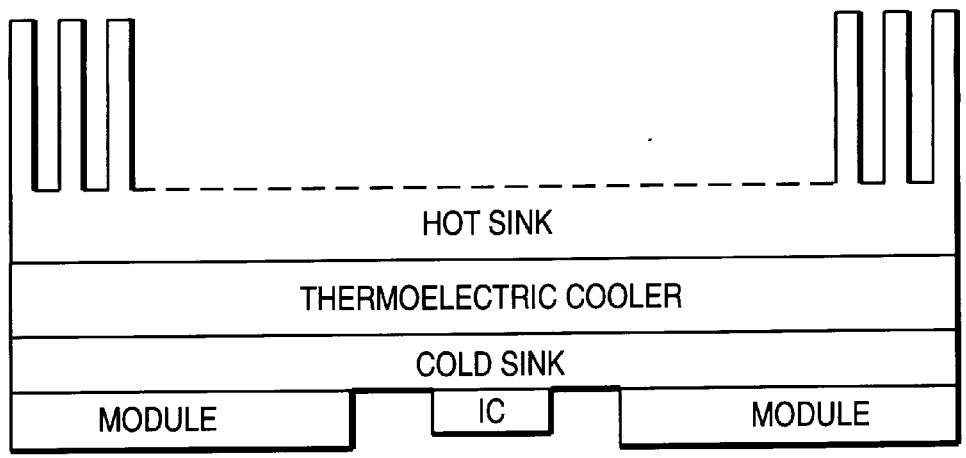
FIG. 8 schematically depicts a thermoelectric cooler as may be used to sub-ambient cool integrated circuits and electronic modules.

FIG. 8 schematically depicts one application for the thermoelectric cooler of the present invention. In this case, the cooler is situated between a heat sink dissipating power into an air ambient and a cold sink having electronic modules and integrated circuits attached thereto.

Figure 9:
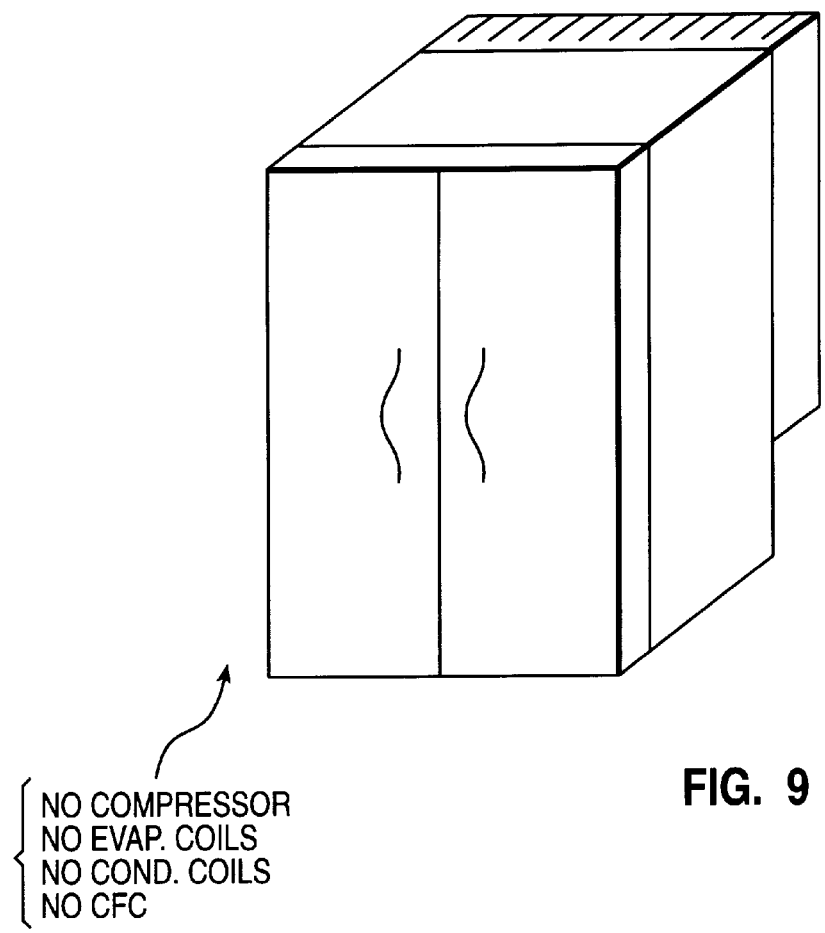
FIG. 9 schematically depicts the extended use of the invention to a food refrigeration system.

FIG. 9 schematically illustrates the use of the thermoelectric cooler in an extended array form to efficiently and cleanly operate a food refrigerator. The high efficiency and lack of major moving parts characterizing the present invention facilitates the migration of thermoelectric cooling from highly selective and limited applications, such as small portable coolers, to major appliances in substantially every home.

Figure 10:
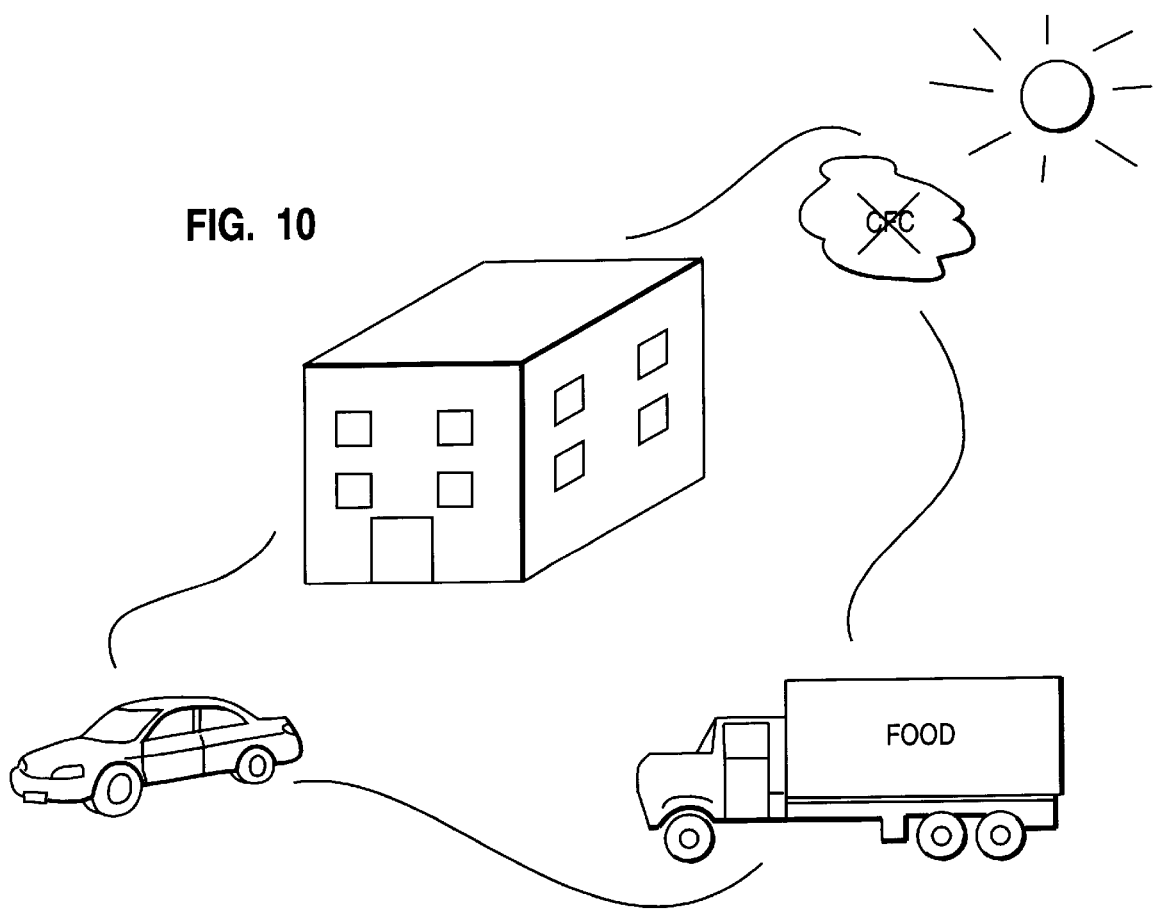
FIG. 10 schematically depicts potential applications and benefits of the invention as applied to various human residences and transportation media.

Still further applications are schematically depicted in FIG. 10, as the concepts underlying the present invention are further refined and extended in size to encompass major heat transfer applications encompassing residential and office cooling, food transportation systems, and personal vehicle cooling.

Figure 11:
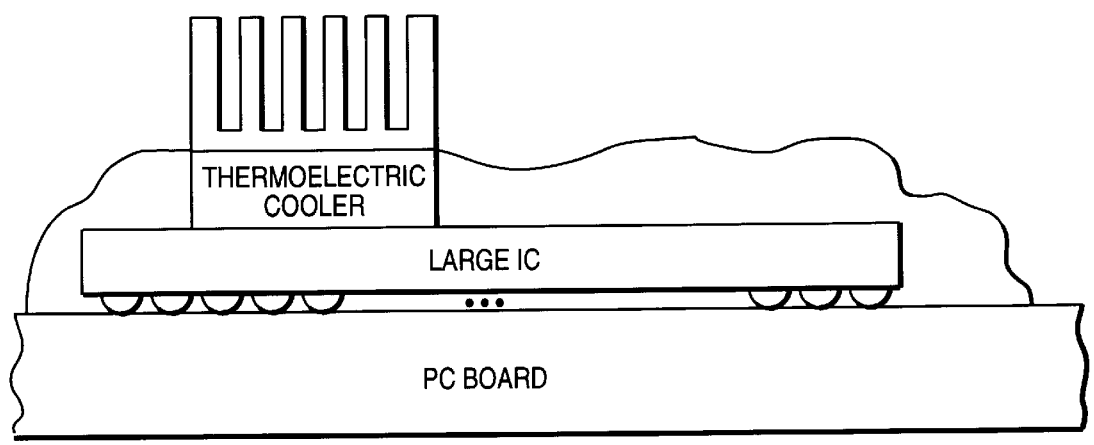
FIG. 11 schematically depicts the application of a small thermoelectric cooler to locally cool a selected part of an integrated circuit chip.

FIG. 11 schematically illustrates an application somewhat at the other end of the spectrum, where micro size thermoelectric coolers are selectively bonded to parts of an integrated circuit chip for purposes of selectively cooling such selected regions to control integrated circuit parameters.

The present invention has very broad applicability in part because it is not constrained to specific thermoelectric materials or electronic configurations. The invention utilizes the thermal dynamics of pulse operated thermoelectric elements in combination with miniature thermal switches to isolate heat transfer characteristics and attain higher cooling efficiency.

It will be understood by those skilled in the art that the embodiment set forth hereinbefore merely exemplary of the numerous arrangements for which the invention may be practiced, and as such may be replaced by equivalents without departing from the invention which will now be defined by appended claims.

I claim:

1. A thermoelectric cooling apparatus, comprising:
   a first thermal sink of a first nominal temperature;
   a second thermal sink of a second nominal temperature, the second temperature being relatively greater than the first temperature;
   a thermoelectric element continuously coupled to the second thermal sink;
   means for selectively switching a thermal coupling of the thermoelectric element to the first thermal sink; and
   means for selectively switching an electrical voltage across the thermoelectric element operable independent from the means for selectively switching the thermal coupling.

2. The apparatus recited in claim 1, wherein the second thermal sink is comprised of first and second electrically separated sections.

3. The apparatus recited in claim 2, wherein the means for selectively switching a thermal coupling and the means for selectively switching an electrical voltage are operable in functional synchronism.

4. The apparatus recited in claim 3, wherein the thermoelectric element is a Peltier device.

5. The apparatus recited in claim 4, wherein the means for selectively switching a thermal coupling is a microelectromechanical system (MEMS) device.

6. The apparatus recited in claim 5, wherein the duty cycle of the means for selectively switching an electrical voltage correlates with the duty cycle of the means for selectively switching a thermal coupling.

7. The apparatus recited in claim 6, wherein the first and second electrically separate sections are coupled to a power supply through the means for selectively switching an electrical voltage.

8. The apparatus recited in claim 5, wherein the first and second electrically separate sections are coupled to a power supply through the means for selectively switching an electrical voltage.

9. The apparatus recited in claim 4, wherein the duty cycle of the means for selectively switching an electrical voltage correlates with the duty cycle of the means for selectively switching a thermal coupling.

10. The apparatus recited in claim 9, wherein the first and second electrically separate sections are coupled to a power supply through the means for selectively switching an electrical voltage.

11. The apparatus recited in claim 4, wherein the first and second electrically separate sections are coupled to a power supply through the means for selectively switching an electrical voltage.

12. The apparatus recited in claim 3, wherein the means for selectively switching a thermal coupling is a microelectromechanical system (MEMS) device.

13. The apparatus recited in claim 12, wherein the duty cycle of the means for selectively switching an electrical voltage correlates with the duty cycle of the means for selectively switching a thermal coupling.

14. The apparatus recited in claim 12, wherein the first and second electrically separate sections are coupled to a power supply through the means for selectively switching an electrical voltage.

15. The apparatus recited in claim 3, wherein the duty cycle of the means for selectively switching an electrical voltage correlates with the duty cycle of the means for selectively switching a thermal coupling.

16. The apparatus recited in claim 15, wherein the first and second electrically separate sections are coupled to a power supply through the means for selectively switching an electrical voltage.

17. The apparatus recited in claim 3, wherein the first and second electrically separate sections are coupled to a power supply through the means for selectively switching an electrical voltage.

18. The apparatus recited in claim 2, wherein the means for selectively switching a thermal coupling is a microelectromechanical system (MEMS) device.

19. The apparatus recited in claim 18, wherein the first and second electrically separate sections are coupled to a power supply through the means for selectively switching an electrical voltage.

20. The apparatus recited in claim 2, wherein the first and second electrically separate sections are coupled to a power supply through the means for selectively switching an electrical voltage.

21. The apparatus recited in claim 1, wherein the means for selectively switching a thermal coupling and the means for selectively switching an electrical voltage are operable in functional synchronism.

22. The apparatus recited in claim 21, wherein the thermoelectric element is a Peltier device.

23. The apparatus recited in claim 22, wherein the means for selectively switching a thermal coupling is a microelectromechanical system (MEMS) device.

24. The apparatus recited in claim 23, wherein the duty cycle of the means for selectively switching an electrical voltage correlates with the duty cycle of the means for selectively switching a thermal coupling.

25. The apparatus recited in claim 22, wherein the duty cycle of the means for selectively switching an electrical voltage correlates with the duty cycle of the means for selectively switching a thermal coupling.

26. The apparatus recited in claim 21, wherein the means for selectively switching a thermal coupling is a microelectromechanical system (MEMS) device.

27. The apparatus recited in claim 26, wherein the duty cycle of the means for selectively switching an electrical voltage correlates with the duty cycle of the means for selectively switching a thermal coupling.

28. The apparatus recited in claim 21, wherein the duty cycle of the means for selectively switching an electrical voltage correlates with the duty cycle of the means for selectively switching a thermal coupling.

29. The apparatus recited in claim 13, wherein the first and second electrically separate sections are coupled to a power supply through the means for selectively switching an electrical voltage.

30. The apparatus recited in claim 1, wherein the means for selectively switching a thermal coupling is a microelectromechanical system (MEMS) device.

31. A thermoelectric cooling apparatus, comprising:
a first thermal sink of a first nominal temperature;
a second thermal sink of a second nominal temperature, the second temperature being relatively greater than the first temperature;
a third thermal sink of the second nominal temperature, the third thermal sink being electrically separate from the second thermal sink;
a first thermoelectric element thermally coupled to the second thermal sink;
a second thermoelectric element thermally coupled to the third thermal sink;
means for selectively switching a thermal coupling of the first and second thermoelectric elements to the first thermal sink; and
means for selectively switching an electrical voltage across the first and second thermoelectric elements operable independent from the means for selectively switching the thermal coupling.

32. The apparatus recited in claim 31, wherein the means for selectively switching a thermal coupling and the means for selectively switching an electrical voltage are operable in functional synchronism.

33. The apparatus recited in claim 32, wherein the first and second thermoelectric elements are Peltier devices.

34. The apparatus recited in claim 33, wherein the first and second thermoelectric elements are of opposite and impurity type.

35. The apparatus recited in claim 34, wherein the means for selectively switching a thermal coupling is a microelectromechanical system (MEMS) device.

36. The apparatus recited in claim 35, wherein the duty cycle of the means for selectively switching an electrical voltage correlates with the duty cycle of the means for selectively switching a thermal coupling.

37. The apparatus recited in claim 34, wherein the duty cycle of the means for selectively switching an electrical voltage correlates with the duty cycle of the means for selectively switching a thermal coupling.

38. The apparatus recited in claim 33, wherein the means for selectively switching a thermal coupling is a microelectrical mechanical system (MEMS) device.

39. The apparatus recited in claim 38, wherein the duty cycle of the means for selectively switching an electrical voltage correlates with the duty cycle of the means for selectively switching a thermal coupling.

40. The apparatus recited in claim 33, wherein the duty cycle of the means for selectively switching an electrical voltage correlates with the duty cycle of the means for selectively switching a thermal coupling.

41. The apparatus recited in claim 32, wherein the means for selectively switching a thermal coupling is a microelectrical mechanical system (MEMS) device.

42. The apparatus recited in claim 41, wherein the duty cycle of the means for selectively switching an electrical voltage correlates with the duty cycle of the means for selectively switching a thermal coupling.

43. The apparatus recited in claim 32, wherein the duty cycle of the means for selectively switching an electrical voltage correlates with the duty cycle of the means for selectively switching a thermal coupling.

44. The apparatus recited in claim 31, wherein the means for selectively switching a thermal coupling is a microelectrical mechanical system (MEMS) device.

45. The apparatus recited in claim 44, wherein the duty cycle of the means for selectively switching an electrical voltage correlates with the duty cycle of the means for selectively switching a thermal coupling.

46. The apparatus recited in claim 31, wherein the duty cycle of the means for selectively switching an electrical voltage correlates with the duty cycle of the means for selectively switching a thermal coupling.

47. A thermoelectric cooling apparatus operable in an ambient, comprising:
a first thermal sink means for dissipating thermal energy at a temperature above the ambient;
a second thermal sink means for absorbing thermal energy at a temperature below the ambient;
a first thermoelectric element coupled to the first thermal sink and coupled to the second thermal sink to transport thermal energy therebetween;
means for selectively switching the thermal conductance of the coupling between the first thermoelectric element and the second thermal sink; and
means for selectively enabling the first thermoelectric element independent of but in relative functional synchronism with the means for selectively switching the thermal conductance.

48. The apparatus recited in claim 47, wherein the means for selectively switching is a microelectromechanical system (MEMS) device.

49. The apparatus recited in claim 48, wherein the duty cycle of the means for selectively enabling correlates with the duty cycle of the means for selectively switching.

50. The apparatus recited in claim 49, wherein the dissipating of the thermal energy is into the ambient, and the absorbing of thermal energy is from a food refrigeration system.

51. The apparatus recited in claim 49, wherein the dissipating of thermal energy is into the ambient and the absorbing of thermal energy is from a vehicle occupant cooling system.

52. The apparatus recited in claim 49, wherein the dissipating of thermal energy is into the ambient and the absorbing of thermal energy is from an electronic integrated circuit device.

53. The apparatus recited in claim 48, wherein the dissipating of the thermal energy is into the ambient, and the absorbing of thermal energy is from a food refrigeration system.

54. The apparatus recited in claim 48, wherein the dissipating of thermal energy is into the ambient and the absorbing of thermal energy is from a vehicle occupant cooling system.

55. The apparatus recited in claim 48, wherein the dissipating of thermal energy is into the ambient and the absorbing of thermal energy is from an electronic integrated circuit device.

56. The apparatus recited in claim 47, wherein the first thermal sink means is comprised of first and second electrically separate sections.

57. The apparatus recited in claim 56, further comprising a second thermoelectric element, the first thermoelectric element being coupled to the first section of the first thermal sink means and the second thermoelectric element being coupled to the second section of the first thermoelectric element, and the second thermoelectric element also coupled to the means for selectively switching.

58. The apparatus recited in claim 56, wherein the dissipating of the thermal energy is into the ambient, and the absorbing of thermal energy is from a food refrigeration system.

59. The apparatus recited in claim 56, wherein the dissipating of thermal energy is into the ambient and the absorbing of thermal energy is from a vehicle occupant cooling system.

60. The apparatus recited in claim 56, wherein the dissipating of thermal energy is into the ambient and the absorbing of thermal energy is from an electronic integrated circuit device.

61. The apparatus recited in claim 57, wherein the means for selectively enabling switches a power supply connected across the first and second sections of the first thermal sink.

62. The apparatus recited in claim 57, wherein the dissipating of the thermal energy is into the ambient, and the absorbing of thermal energy is from a food refrigeration system.

63. The apparatus recited in claim 57, wherein the dissipating of thermal energy is into the ambient and the absorbing of thermal energy is from a vehicle occupant cooling system.

64. The apparatus recited in claim 57, wherein the dissipating of thermal energy is into the ambient and the absorbing of thermal energy is from an electronic integrated circuit device.

65. The apparatus recited in claim 61, wherein the means for selectively enabling switches a power supply connected across the first and second sections of the first thermal sink.

66. The apparatus recited in claim 61, wherein the dissipating of the thermal energy is into the ambient, and the absorbing of thermal energy is from a food refrigeration system.

67. The apparatus recited in claim 61, wherein the dissipating of thermal energy is into the ambient and the absorbing of thermal energy is from a vehicle occupant cooling system.

68. The apparatus recited in claim 61, wherein the dissipating of thermal energy is into the ambient and the absorbing of thermal energy is from an electronic integrated circuit device.

69. The apparatus recited in claim 65, wherein the means for selectively enabling switches a power supply connected across the first and second sections of the first thermal sink.

70. The apparatus recited in claim 65, wherein the dissipating of the thermal energy is into the ambient, and the absorbing of thermal energy is from a food refrigeration system.

71. The apparatus recited in claim 65, wherein the dissipating of thermal energy is into the ambient and the absorbing of thermal energy is from a vehicle occupant cooling system.

72. The apparatus recited in claim 65, wherein the dissipating of thermal energy is into the ambient and the absorbing of thermal energy is from an electronic integrated circuit device.

73. The apparatus recited in claim 69, wherein the dissipating of the thermal energy is into the ambient, and the absorbing of thermal energy is from a food refrigeration system.

74. The apparatus recited in claim 69, wherein the dissipating of thermal energy is into the ambient and the absorbing of thermal energy is from a vehicle occupant cooling system.

75. The apparatus recited in claim 69, wherein the dissipating of thermal energy is into the ambient and the absorbing of thermal energy is from an electronic integrated circuit device.

76. The apparatus recited in claim 47, wherein the dissipating of the thermal energy is into the ambient, and the absorbing of thermal energy is from a food refrigeration system.

77. The apparatus recited in claim 69, wherein the dissipating of thermal energy is into the ambient and the absorbing of thermal energy is from a vehicle occupant cooling system.

78. The apparatus recited in claim 47, wherein the dissipating of thermal energy is into the ambient and the absorbing of thermal energy is from an electronic integrated circuit device.

79. A method of operating a thermoelectric cooling apparatus having a first thermal sink operable at a first nominal temperature, a second thermal sink operable at a second nominal temperature relatively greater than the first nominal temperature, and a thermoelectric element coupled to the second thermal sink, comprising the steps of:

transmitting thermal energy from the thermoelectric element to the second thermal sink through a continuous coupling;

selectively switching the transmission of thermal energy between the thermoelectric element and the first thermal sink; and selectively enabling an electric voltage across the thermoelectric element independent of the selective switching of the transmission of thermal energy.

80. The method recited in claim 79, wherein the steps of selectively switching and selectively enabling an electric voltage are accomplished in functional synchronism.

81. The method recited in claim 80, wherein the step of selectively switching is accomplished with a microelectromechanical system (MEMS) device.

82. The method recited in claim 81, wherein the duty cycle of the step of selectively enabling an electric voltage correlates with the duty cycle of the step of selectively switching.

83. The method recited in claim 80, wherein the duty cycle of the step of selectively enabling an electric voltage is similar to the duty cycle of the step of selectively switching.

84. The method recited in claim 79, wherein the step of selectively switching is accomplished with a microelectromechanical system (MEMS) device.

85. A method of operating a thermoelectric cooling apparatus having a first thermal sink operable at a first nominal temperature, a second thermal sink operable at a second nominal temperature relatively greater than the first nominal temperature, a third thermal sink operable at the second nominal temperature and in electric separation from the second thermal sink, a first thermoelectric element coupled to the second thermal sink, a second thermoelectric element thermally coupled to the third thermal sink, comprising the steps of:

transmitting thermal energy from the first thermoelectric element to the second thermal sink through a continuous coupling;

transmitting thermal energy from the second thermoelectric element to the third thermal sink through a continuous coupling;

selectively switching the transmission of thermal energy between the first and second thermoelectric elements and the first thermal sink; and selectively enabling an electric voltage across the first and second thermoelectric elements independent from the selective switching of the transmission of thermal energy.

86. The method recited in claim 85, wherein the steps of selectively switching and selectively enabling an electric voltage are accomplished in functional synchronism.

87. The method recited in claim 86, the step of selectively switching is accomplished with a microelectromechanical system (MEMS) device.

88. The method recited in claim 87, the duty cycle of the step of selectively enabling an electric voltage correlates with the duty cycle of the step of selectively switching.

89. A method of operating a thermoelectric cooling apparatus having a first thermal sink for dissipating thermal energy at a temperature above an ambient, a second thermal sink for absorbing thermal energy at a temperature below the ambient, and a thermoelectric element coupled between the first and second thermal sinks to transport thermal energy therebetween, comprising the steps of:

transmitting thermal energy from the thermoelectric element to the first thermal sink through a continuous coupling;

selectively switching the thermal conductance of the coupling between the thermoelectric element and the second thermal sink; and selectively enabling the thermoelectric element independent from but in relative functional synchronism with the selective switching of the thermal conductance.

90. The method recited in claim 89, wherein the step of selectively enabling comprises a switching of an electric voltage the thermoelectric element.

91. The method recited in claim 90, wherein the step of selectively switching the thermal conductance is accomplished with a microelectromechanical system (MEMS) device.

92. The method recited in claim 91, wherein the duty cycle of the step of selectively switching an electric voltage correlates with the duty cycle of the step of selectively switching the thermal conductance.

\* \* \* \* \*